United States Patent
Huang et al.

(10) Patent No.: US 8,383,432 B2
(45) Date of Patent: Feb. 26, 2013

(54) COLLOIDAL-PROCESSED SILICON PARTICLE DEVICE

(75) Inventors: Jiandong Huang, Vancouver, WA (US);
Liang Tang, Vancouver, WA (US);
Changqing Zhan, Vancouver, WA (US);
Chang-Ching Tu, Seattle, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 22 days.

(21) Appl. No.: 12/835,974

(22) Filed: Jul. 14, 2010

(65) Prior Publication Data

US 2011/0032743 A1 Feb. 10, 2011

Related U.S. Application Data

(63) Continuation-in-part of application No. 12/187,605, filed on Aug. 7, 2008, now Pat. No. 8,007,332, and a continuation-in-part of application No. 12/836,030, filed on Jul. 14, 2010.

(51) Int. Cl.
*H01L 21/00* (2006.01)

(52) U.S. Cl. .......................................... 438/29; 313/506

(58) Field of Classification Search .................... 438/26, 438/29; 313/498–512; 257/13, 103
See application file for complete search history.

(56) References Cited

U.S. PATENT DOCUMENTS

| | | | |
|---|---|---|---|
| 6,791,883 B2 * | 9/2004 | Swift et al. ............... | 365/185.29 |
| 7,265,488 B2 * | 9/2007 | Ng et al. ....................... | 313/501 |
| 7,422,504 B2 * | 9/2008 | Maeda et al. ................... | 445/24 |
| 7,727,843 B2 * | 6/2010 | Ishihara et al. ............... | 438/288 |
| 7,813,160 B2 * | 10/2010 | Drndic et al. ................. | 365/151 |
| 2003/0227249 A1 * | 12/2003 | Mueller et al. ................ | 313/491 |
| 2004/0007947 A1 * | 1/2004 | Takahashi et al. ............ | 310/363 |
| 2005/0121393 A1 * | 6/2005 | Galbraith ...................... | 210/670 |
| 2007/0272995 A1 * | 11/2007 | King et al. ..................... | 257/440 |
| 2007/0278076 A1 | 12/2007 | Murooka | |
| 2008/0193747 A1 * | 8/2008 | MacDonald et al. ......... | 428/336 |
| 2009/0018668 A1 * | 1/2009 | Galbraith .................... | 623/23.65 |
| 2009/0071539 A1 * | 3/2009 | Choi et al. ..................... | 136/258 |
| 2009/0134380 A1 * | 5/2009 | Chen .............................. | 257/13 |
| 2009/0139571 A1 * | 6/2009 | Chen et al. .................... | 136/258 |
| 2009/0152583 A1 * | 6/2009 | Chen et al. ..................... | 257/98 |
| 2011/0240996 A1 * | 10/2011 | Lin et al. ........................ | 257/43 |

FOREIGN PATENT DOCUMENTS

| | | |
|---|---|---|
| JP | 7-226522 | 8/1995 |
| JP | 2001-93274 | 4/2001 |
| JP | 2005-228804 | 8/2005 |
| JP | 2007-103828 | 4/2007 |

OTHER PUBLICATIONS

Duncan Graham-Rowe, "From dots to devices", nature photonics, vol. 3, Jun. 2009, pp. 307.
Melburne C. LeMieux and Zhenan Bao, 'Stretching our imagination', nature nanotechnology, vol. 3, Oct. 2008, pp. 585.

* cited by examiner

*Primary Examiner* — Anh Mai
(74) *Attorney, Agent, or Firm* — Law Office of Gerald Maliszewski; Gerald Maliszewski

(57) ABSTRACT

Colloidal-processed Si particle devices, device fabrication, and device uses have been presented. The generic device includes a substrate, a first electrode overlying the substrate, a second electrode overlying the substrate, laterally adjacent the first electrode, and separated from the first electrode by a spacing. A colloidal-processed Si particle layer overlies the first electrode, the second electrode, and the spacing between the electrodes. The Si particle layer includes a first plurality of nano-sized Si particles and a second plurality of micro-sized Si particles.

5 Claims, 5 Drawing Sheets

COLLOIDAL-PROCESSED SILICON PARTICLE DEVICE

RELATED APPLICATIONS

This application is a Continuation-in-Part of a pending application entitled, FABRICATION OF NANOPARTICLE EMBEDDED INSULATING FILM ELECTROLUMINESCENCE DEVICE, invented by Pooran Joshi et al, Ser. No. 12/187,605, filed on Aug. 7, 2008, now U.S. Pat. No. 8,007, 332;

This application is a Continuation-in-Part of a patent application entitled, SILICON SURFACE MODIFICATION FOR THE ELECTROCHEMICAL SYNTHESIS OF SILICON PARTICLES IN SUSPENSION, invented by Chang-Ching Tu et al., Ser. No. 12/836,030, filed Jul. 14, 2010.

Both the above-mentioned applications are incorporated herein by reference.

BACKGROUND OF THE INVENTION

1. Field of the Invention

This invention generally relates to integrated circuit (IC) fabrication and, more particularly to memory and optoelectrical devices made from colloidal-processed silicon particles.

2. Description of the Related Art

Colloidal inorganic semiconductor quantum dots (QDs)/particles are finding use as building materials in optoelectronic devices. This technology is attractive as it permits devices to be fabricated on flexible substrates by low-temperature solution-processing methods, such as spin-coating, drop-casting, and inkjet printing. At the same time, like their bulk semiconductor counterparts, semiconductor QDs/particles exhibit broadband absorption and efficient charge transport properties due to the crystalline structure of the particle core. Furthermore, resulting from the quantum confinement effect, the bandgaps of the semiconductor QDs/particles can be adjusted by simply varying the particle sizes. The smaller size leads to the higher degree of confinement and the larger bandgap. Various optoelectronic applications based on these semiconductor materials have been demonstrated and shown superior performance, including photodetectors, light-emitting diodes, and solar cells. However, these QDs/particles are usually Pb- or Cd-chalcogenide based, and are highly toxic due to their heavy metal ingredients.

Unlike compound semiconductors, silicon (Si) is biocompatible and electrochemically stable. Furthermore, owing to the needs of the microelectronics industry, Si has been well studied for the past several decades. Therefore, the development of solution-processable colloidal Si materials that retain some bulk crystalline characteristics, while achieving enhanced optical properties due to high degree of confinement, implies an interesting path of research. Extensive work has been devoted to the synthesis of Si nanoparticles, including solution-based precursor reduction or thermal decomposition, laser induced silane aerosol pyrolysis, nonthermal plasma synthesis, and etching of silicon rich oxide (SRO) thin film. However, these methods invariably require critical processing condition, special equipment, and complex purification procedures.

On the other hand, it has been reported that electrochemical etching, which only requires commercially available Si wafers, common electrolytes, and is performed in an ambient condition, can be utilized to synthesize photoluminescent porous Si nanostructures. Free standing Si nanoparticles are then prepared by pulverizing the porous Si wafers in an ultrasonication bath. This method is especially promising for low-cost, large-quantity, high-throughput production of Si nanoparticles. Notably, by varying etching condition, not only nanoparticles but also micro-scale wires or pillars can be generated.

It would be advantageous if nano to micro-scale silicon particles could be used to fabricate optoelectronic and electronic devices, using low temperature processes that do not require expensive vacuum equipment.

SUMMARY OF THE INVENTION

Colloidal silicon particle solutions are presented that create nano to micro-scale Si structures on wafer surfaces. These Si wafers are further processed by ultrasonic bathing to remove and disperse those Si particles into aqueous or organic solvents. The colloidal solutions can form films on desired substrates by spin or drop-coating, followed by baking or vacuum drying processes to remove the solvents. For photoluminescence (PL) applications, since bulk Si is indirect material, large Si particles of micrometer sizes are not expected to be PL efficient. So it is desirable to use nanometer scale Si particles for PL and electroluminescence (EL) applications. On the other hand, electronic devices require good conductivity between Si particles to support carrier transports, and micrometer scale particles are desirable for these applications. In addition, the bandgap engineering of nano-scale Si particles can be used in solar cells and optoelectronic applications. The Si particles may be filtered to control size distribution, depending upon the application.

Accordingly, a colloidal-processed silicon (Si) particle device is provided. The generic device includes a substrate, a first electrode overlying the substrate, a second electrode overlying the substrate, laterally adjacent the first electrode, and separated from the first electrode by a spacing. A colloidal-processed Si particle layer overlies the first electrode, the second electrode, and the spacing between the electrodes. The Si particle layer includes a first plurality of nano-sized Si particles and a second plurality of micro-sized Si particles.

In one aspect, the device is a memory cell. In this aspect, a negative first bias voltage applied between the first and second electrodes, creates a negative residual current in response to a subsequent application of a zero voltage. Likewise, a positive second bias voltage applied between the first and second electrode, creates a positive residual current in response to a subsequent application of a zero voltage.

In another aspect, the device is a light sensing device. A first resistance between the first and second electrodes can be measured in response to a first bias voltage in a dark ambient condition. When the device is illuminated with light in the spectrum between ultra-violet and visible, a second resistance, less than the first resistance, is measured in response to the first bias voltage.

Additional details of the above-described devices and associated methods for fabrication and use are presented below.

DETAILED DESCRIPTION

Figure 1:
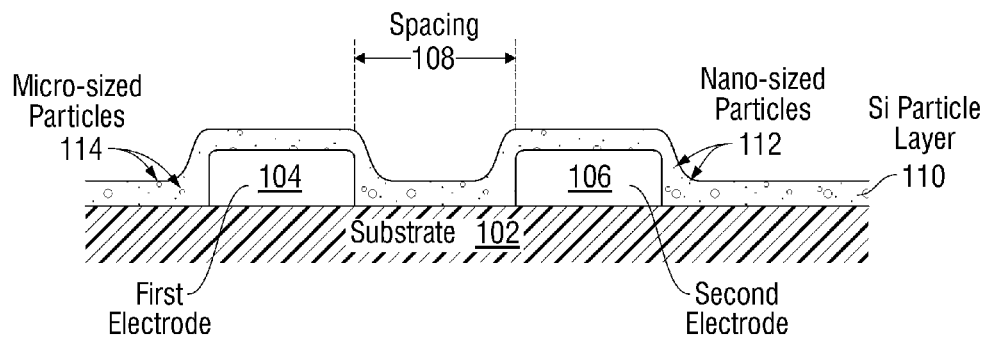
FIG. 1 is a partial cross-sectional view of a colloidal-processed silicon (Si) particle device.

FIG. 1 is a partial cross-sectional view of a colloidal-processed silicon (Si) particle device. The device 100 comprises a substrate 102, a first electrode 104 overlying the substrate 102, and a second electrode 106 overlying the substrate 102, laterally adjacent the first electrode 104, and separated from the first electrode 104 by a spacing 108. The electrodes 104/106 may be a metal, for example. The substrate 102 may be an insulator such as $SiO_2$ or a plastic. A colloidal-processed Si particle layer 110 overlies the first electrode 104, the second electrode 106, and the spacing between the electrodes 108. In one aspect, the spacing is about 10 microns. The Si particle layer 110 includes a first plurality of nano-sized Si particles 112 and a second plurality of micro-sized Si particles 114. In one aspect, the micro-sized Si particles 114 are rod-shaped, having a length of about 10 microns and a diameter of about 2 micron. The nano-sized Si particles 112 may have a spherical shape with a diameter in the range of 1 to 5 nanometers. Note: the depicted particle sizes are not drawn to scale.

The inclusion of microstructures, in addition to nanoparticles, in the colloid used to form the device shows beneficial effects in both device fabrication and performance for light-absorbing applications, such as photodetectors and solar cells. It is easier to use micro-size particle suspension to fabricate thicker films, which is especially desirable for indirect band gap semiconductors like Si to achieve high absorption. The presence of these micro-size particles increases scattering within the film and, therefore, overall efficiency. Furthermore, microparticles with a smaller surface-to-volume ratio than nanoparticles suffer less from the effect of surface ligand passivation, which increases inter-particle spacing and decreases charge carrier mobility in the thin film.

In one aspect, the device 100 is a memory cell. Thus, a negative first bias voltage applied between the first electrode 104 and second electrode 106, creates a negative residual current in response to a subsequent application of a zero voltage. Likewise, when a positive second bias voltage is applied between the first electrode 104 and the second electrode 106, a positive residual current is created in response to a subsequent application of a zero voltage.

Figure 2:
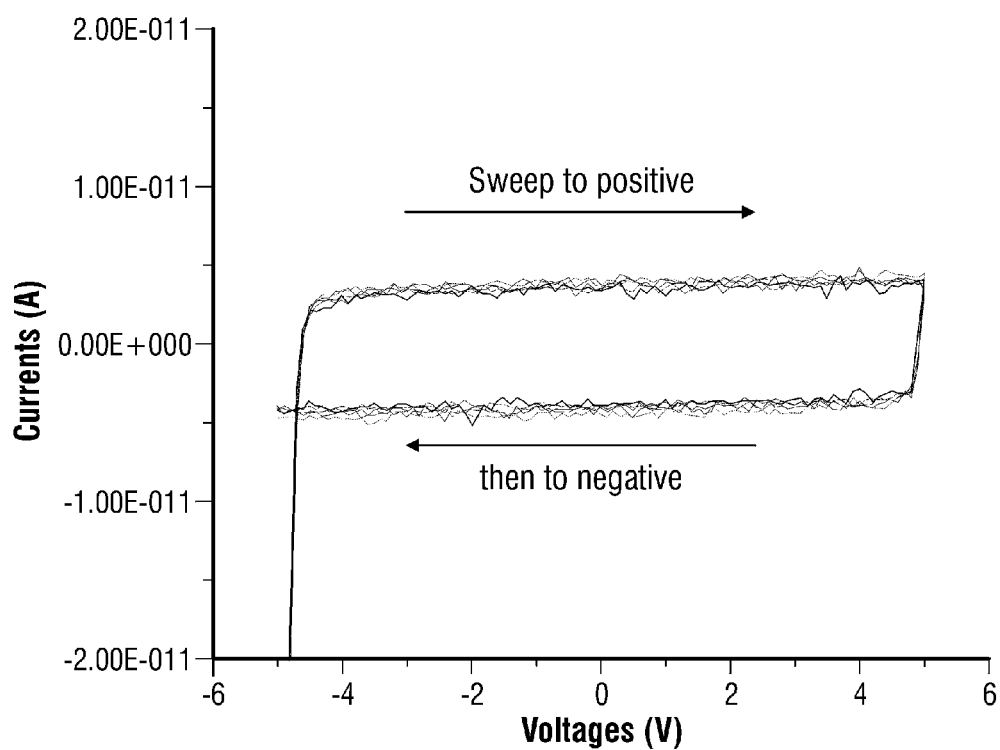
FIG. 2 is a graph depicting current-voltage (I-V) curves of the device of FIG. 1 as measured in a dark chamber.

FIG. 2 is a graph depicting current-voltage (I-V) curves of the device of FIG. 1 as measured in a dark chamber. The curves clearly show hysteresis behavior. This hysteresis behavior can be attributed to the isolated state of Si particle surface charges. The hysteresis behavior indicates that charges have been stored inside the Si particle layer.

Generally, hysteresis refers to systems with a memory, where the effects of input current or voltage are experienced with a certain delay in time. Hysteresis is an important property in a memory device such as a magnetic storage media hard disk. In a memory material, one polarity may represent a 1-bit, while the opposite polarity represents a 0-bit. However, to change the storage from one to the other, the hysteresis effect requires the knowledge of what was already there, because the needed field will be different in each case. In order to avoid this problem, recording systems first overdrive the entire system into a known state using a process known as bias. Different materials require different biasing.

Figure 3:
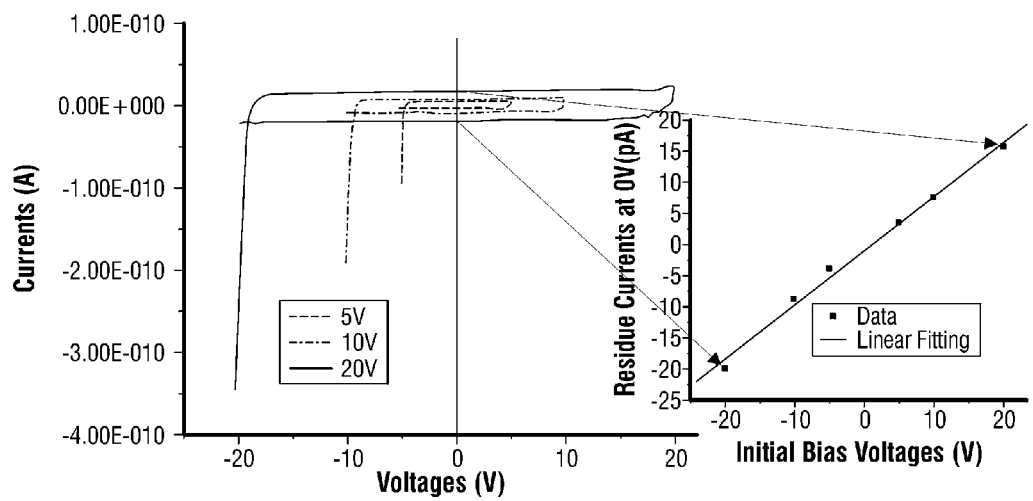
FIG. 3 shows graphs illustrating the nearly linear dependence between residue currents and initial bias voltages.

FIG. 3 shows graphs illustrating the nearly linear dependence between residue currents and initial bias voltages. This type of behavior shows the potential of the device of FIG. 1 for use in memory applications. Functions such as write-once and read-many times can be realized as well, due to the large voltage and low peak current levels. The left-most graph depicts sweeping I-V curves with different initial bias voltages. The right-most graph depicts the near linear dependence of the residue or residual currents, $I_{Res}$. The $I_{Res}$ currents are defined as the current levels when the device bias voltage drops to zero, after initial charging with negative and positive bias voltages.

Returning to FIG. 1, the device 100 can also be used as a light sensing device. As such, a first resistance is created between the first and second electrodes in response to a first bias voltage in a dark ambient condition. A second resistance, less than the first resistance, is created in response to the first bias voltage, when the device is illuminated with light in the spectrum between ultra-violet and visible.

Figure 4:
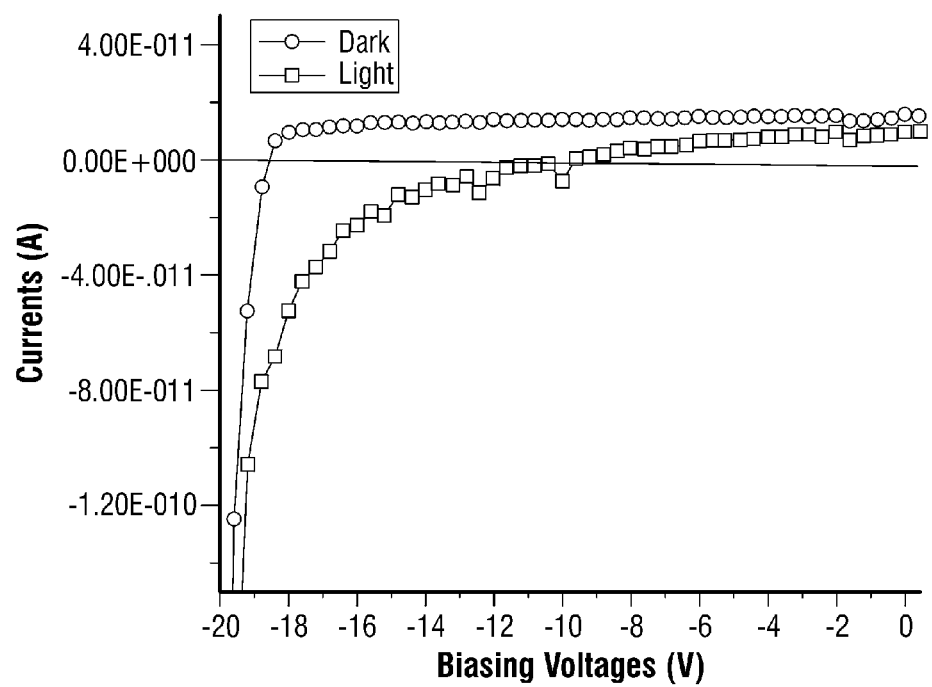
FIG. 4 is a graph depicting I-V responses under contrasting light illumination.

FIG. 4 is a graph depicting I-V responses under contrasting light illumination. A broadband white light beam was used to illuminate the area between the electrodes. With light on and off, the I-V curves demonstrate different responses, as shown in the figure. From the data, it is shown that even without optimizing the pump wavelengths, the zero current voltages, $V_{Zero}$, differ about 9Vs (10 v vs 19V) from the 20V initial bias voltage. $V_{Zero}$ is defined as the cross voltage as the current drops to zero for the device. The large difference between voltages can be used to remove the stored charges for the memory applications, see FIGS. 2 and 3. In addition, this large photo response can be used to sense ambient light, making the device useful for photodetector applications.

Functional Description

Figure 5:
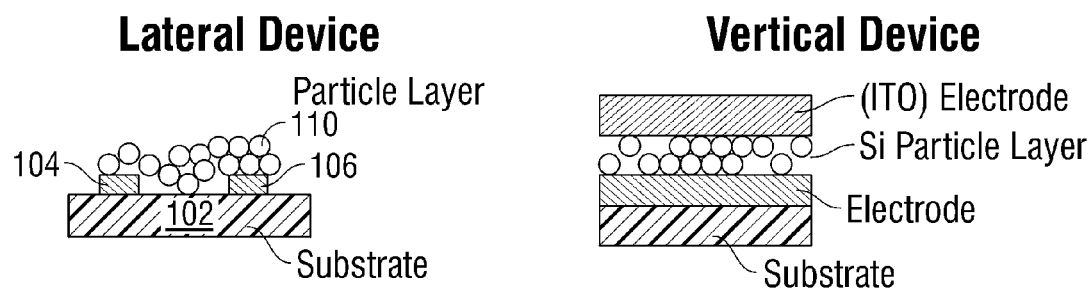
FIG. 5 is a partial cross-sectional view contrasting devices with lateral and vertical electrode placement.

FIG. 5 is a partial cross-sectional view contrasting devices with lateral and vertical electrode placement. Devices can be fabricated with Si particles sandwiched between top or bottom electrodes, as shown in left-most device. This approach generally leads to lower operational voltages due to the very thin Si particle layers. However, it is also possible to use vertically placed electrodes with Si particles spread between them to form functional devices, as shown in the right side of the figure.

Parent application Ser. No. 12/187,605, entitled FABRICATION OF NANOPARTICLE EMBEDDED INSULATING FILM ELECTROLUMINESCENCE DEVICE, invented by Pooran Joshi et al., demonstrates a device with an active layer made from embedding silicon nanoparticles in a SiOx or SiNx film using vacuum processing techniques. The driving electrical fields applied on the active layer of such a device are ~50 megavolts per meter (MV/m). Using the lateral electrode device of FIG. 1, similar optical results can be obtained using fields that are one order of magnitude smaller.

Figure 6:
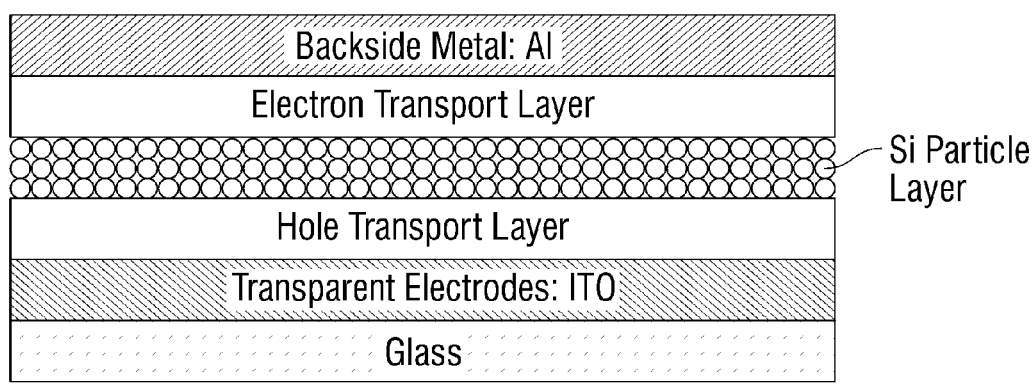
FIG. 6 is a partial cross-sectional view of a device with a vertical electrode arrangement.

FIG. 6 is a partial cross-sectional view of a device with a vertical electrode arrangement. This device has the potential to create high electrical fields across the Si nanoparticle layers using reasonable voltages. In addition, balanced carrier injection for this type of EL device improves external efficiencies.

Baking conditions may also be a key to improved device performance. In response to different baking temperatures, the morphologies of deposited thin films show clearly different structures that dramatically effect PL response.

The colloidal solution used to fabricate the devices can be made by electrochemically etching p-type boron-lightly-doped Si wafers, with (100) orientation and 5-20 ohm-cm resistivity, in a mixture of HF, methanol, $H_2O_2$ and polyoxometalates (POMs), where the latter two function as catalyst. At high current density (>10 $mA/cm^2$) and an etching time of several hours, typical etched surface structures are micropores of diameter around 2 microns. Generally, more microstructures are found close to the meniscus region (air-liquid interface), as a result of gradually decreasing current density away from the liquid surface. In proper etching conditions, the electrochemically etched Si surface should be mostly hydrogen-terminated, and should become hydrophobic. For more saturated hydrogen-passivation and removal of carbon and oxide residues, the etched Si wafer is treated in 24% HF for 4 minutes prior to further steps.

The hydrogen-terminated surface can be converted to alkyl-termination to have a stable surface passivation. Here the unsaturated double bond of 1-octene is used to react with the hydrogen-terminated Si surface through hydrosilylation reaction with chloroplatinic acid as catalyst, resulting in octane-modified Si surface. After the surface modification, the porous Si wafer is immersed in 1-octene/hexane (1/1 volume) as dispersion medium, and is ultra-sonicated for 5 minutes. Without hydrosilylation reaction, the Si nano/micro particle composites can suspend for only a few minutes after ultra-sonication and then begin to agglomerate into millimeter-size precipitates. In contrast, the octane-modified composites stay in suspension for several days without obvious aggregation.

A thin film can be formed by drop-casting the colloidal Si suspension. Two effective ways to increase the coverage of Si nano/micro particles include multiple drop-casting and condensing of the suspension by ultra-sonicating a larger area of etched Si wafer in a smaller volume of solvent. Here, approximately 3 $cm^2$ of etched Si wafer is dispersed in 1 mL of the 1-octene/hexane solvent.

Figure 7:
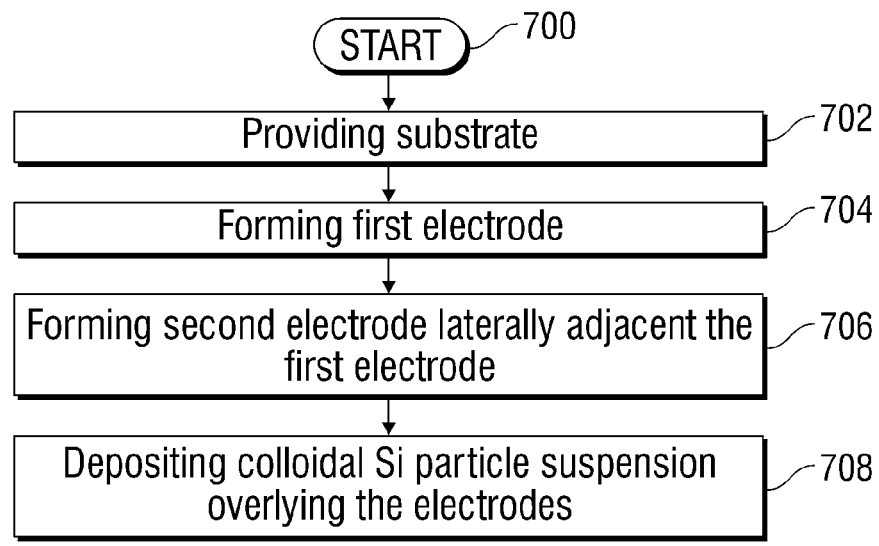
FIG. 7 is a flowchart illustrating a process for forming a colloidal-processed Si particle device.

FIG. 7 is a flowchart illustrating a process for forming a colloidal-processed Si particle device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 700.

Step 702 provides a substrate, such a silicon dioxide or a plastic insulating material. Step 704 forms a first electrode overlying the substrate. Step 706 forms a second electrode overlying the substrate, laterally adjacent the first electrode, and separated from the first electrode by a spacing. Typically, the electrodes are a metal material. Step 708 deposits a colloidal Si particle suspension overlying the first electrode, the second electrode, and the spacing between the electrodes. The colloidal Si particle suspension includes a first plurality of nano-sized Si particles and a second plurality of micro-sized Si particles suspended in a non-polar evaporative solvent with alkene. Typically, the micro-sized Si particles have a rod shape with a length of about 10 microns and a diameter of about 1 micron, and nano-sized Si particles have a spherical shape with a diameter in the range of 1 to 5 nanometers.

In one aspect, Step 708 suspends colloidal Si particles in a hexane/1-octene (1/1 volume ratio) solvent. Then, the deposited suspension includes 1-octene bonded with the hydrogen-terminated Si particles, forming modified Si particles formed from octane capping ligands attached to the Si particles.

In one aspect, Step 708 deposits the colloidal Si particles using a drop-casting, screen printing, spin-coating, or inkjet printing process.

Figure 8:
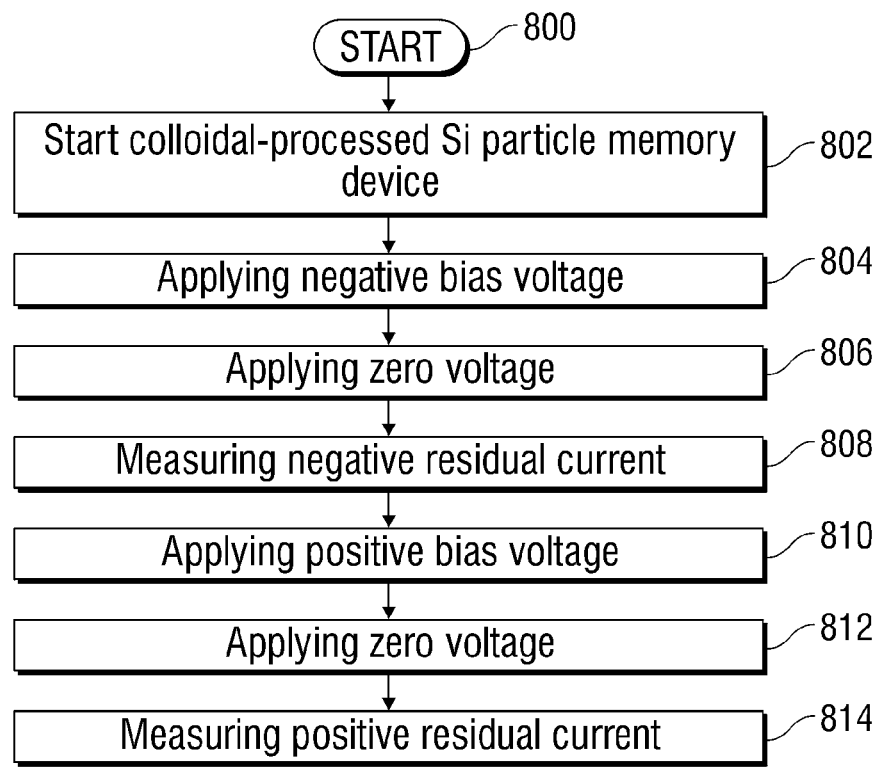
FIG. 8 is a flowchart illustrating a method for creating a residual current in response to a bias voltage, in a colloidal-processed Si particle memory device.

FIG. 8 is a flowchart illustrating a method for creating a residual current in response to a bias voltage, in a colloidal-processed Si particle memory device. The method starts at Step 800. Step 802 provides a memory device including a substrate, a first electrode overlying the substrate, a second electrode overlying the substrate, laterally adjacent the first electrode, and separated from the first electrode by a spacing. A colloidal-processed Si particle layer overlies the first electrode, the second electrode, and the spacing between the electrodes. The Si particle layer includes a first plurality of nano-sized Si particles and a second plurality of micro-sized Si particles. Step 804 applies a negative first bias voltage between the first and second electrodes. Subsequent to applying the first bias voltage, Step 806 applies a zero voltage. Step 808 measures a negative residual current between the first and second electrodes in response to the zero voltage.

Step 810 applies a positive second bias voltage between the first and second electrodes. Subsequent to applying the second bias voltage, Step 812 applies a zero voltage between the first and second electrodes. Step 814 measures a positive residual current between the first and second electrodes, in response to the zero voltage.

Figure 9:
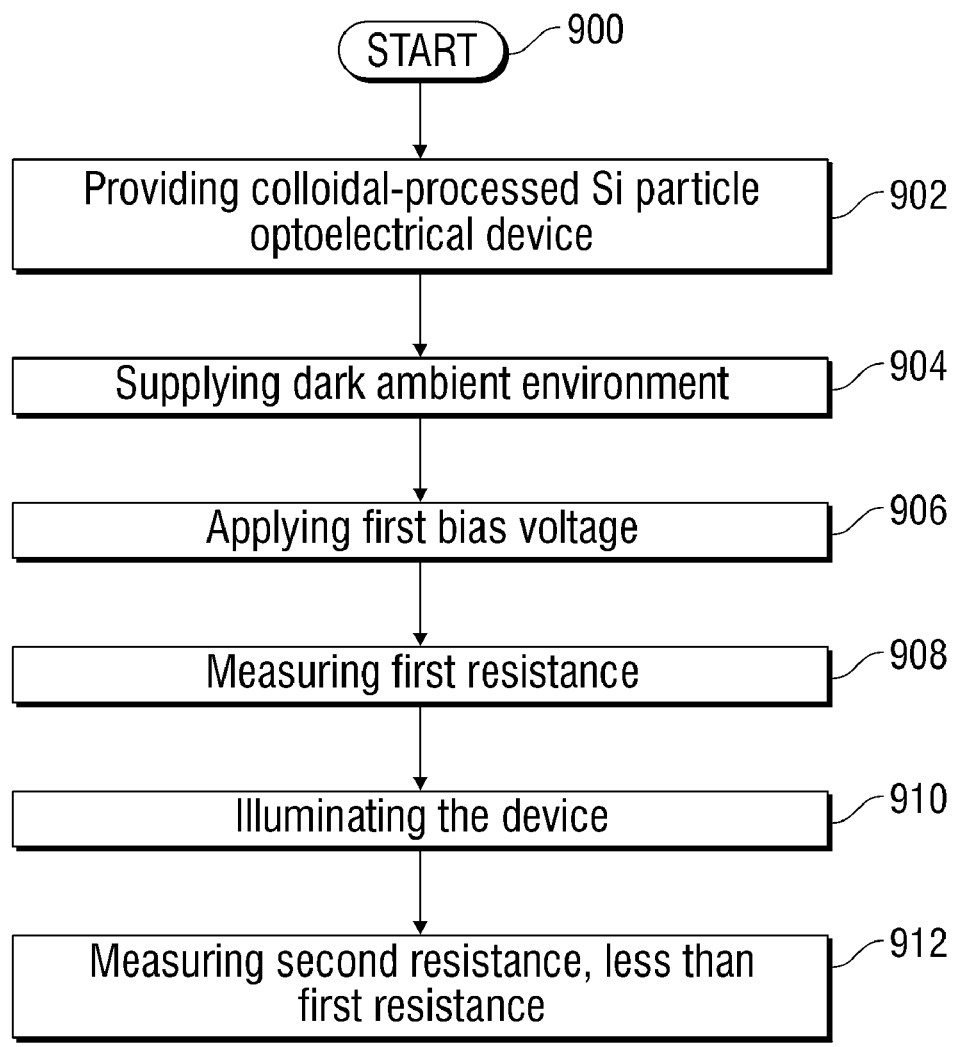
FIG. 9 is a flowchart illustrating a method for sensing light using a colloidal-processed Si particle optoelectrical device.

FIG. 9 is a flowchart illustrating a method for sensing light using a colloidal-processed Si particle optoelectrical device. The method starts at Step 900. Step 900 provides an optoelectrical device including a substrate, a first electrode overlying the substrate, a second electrode overlying the substrate, laterally adjacent the first electrode, and separated from the first electrode by a spacing. A colloidal-processed Si particle layer overlies the first electrode, the second electrode, and the spacing between the electrodes. The Si particle layer includes a first plurality of nano-sized Si particles and a second plurality of micro-sized Si particles. Step 904 supplies a dark ambient illumination environment. Step 906 applies a first bias voltage between the first and second electrodes. Step 908 measures a first resistance between the first and second electrodes in response to the dark ambient illumination environment and the first bias voltage. Step 910 illuminates the device with light in the spectrum between ultra-violet and visible. Step 912 measures a second resistance, less than the first resistance, in response to the first bias voltage and the light illumination.

Colloidal-processed Si particle devices, device fabrication, and device uses have been presented. Explicit structures and process steps were presented as examples to illustrate the invention. However, the invention is not limited to just these examples. Other variations and embodiments of the invention will occur to those skilled in the art.

We claim:

1. A process for forming a colloidal-processed silicon (Si) particle device, the process comprising:
   providing a substrate;
   forming a first electrode overlying the substrate;
   forming a second electrode overlying the substrate, laterally adjacent the first electrode, and separated from the first electrode by a spacing; and,
   depositing a colloidal Si particle suspension overlying the first electrode, the second electrode, and the spacing between the electrodes, the colloidal Si particle suspension including a first plurality of nano-sized Si particles and a second plurality of micro-sized Si particles suspended in a non-polar evaporative solvent with alkene.

2. The method of claim 1 wherein depositing the colloidal Si particle suspension includes suspending colloidal Si particles in a hexane/1-octene (1/1 volume ratio) solvent.

3. The method of claim 2 wherein depositing the colloidal Si particle suspension includes depositing 1-octene bonded with hydrogen-terminated Si particles, forming modified Si particles formed from octane capping ligands attached to the Si particles.

4. The method of claim 1 wherein depositing the colloidal Si particle suspension includes depositing the colloidal Si pg,17 particles using a process selected from a group consisting of drop-casting, screen printing, spin-coating, and inkjet printing.

5. The method of claim 1 wherein depositing the colloidal Si particle suspension includes depositing micro-sized Si particles having a rod shape with a length of about 10 microns and a diameter of about 1 micron, and nano-sized Si particles having a spherical shape with a diameter in a range of 1 to 5 nanometers.

* * * * *

UNITED STATES PATENT AND TRADEMARK OFFICE
CERTIFICATE OF CORRECTION

| | |
|---|---|
| PATENT NO. | : 8,383,432 B2 |
| APPLICATION NO. | : 12/835974 |
| DATED | : February 26, 2013 |
| INVENTOR(S) | : Jiandong Huang et al. |

It is certified that error appears in the above-identified patent and that said Letters Patent is hereby corrected as shown below:

Col. 7, line 10 Claim 4 should read as follows:
4. The method of claim 1 wherein depositing the colloidal Si particle suspension includes depositing the colloidal Si particles using a process selected from a group consisting of drop-casting, screen printing, spin-coating, and inkjet printing.

Signed and Sealed this
Ninth Day of April, 2013

Teresa Stanek Rea
*Acting Director of the United States Patent and Trademark Office*